(12) United States Patent
Takiguchi et al.

(10) Patent No.: US 9,793,261 B2
(45) Date of Patent: Oct. 17, 2017

(54) POWER SEMICONDUCTOR DEVICE

(71) Applicant: Kabushiki Kaisha Toshiba, Minato-Ku, Tokyo (JP)

(72) Inventors: Masaaki Takiguchi, Kawasaki Kanagawa (JP); Katsuhisa Kawasaki, Yamato Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/061,017

(22) Filed: Mar. 4, 2016

(65) Prior Publication Data

US 2017/0069622 A1    Mar. 9, 2017

(30) Foreign Application Priority Data

Sep. 9, 2015 (JP) .................................. 2015-177695

(51) Int. Cl.
| | | |
|---|---|---|
| *H01L 33/24* | (2010.01) | |
| *H01L 27/06* | (2006.01) | |
| *H01L 27/092* | (2006.01) | |
| *H01L 29/872* | (2006.01) | |

(52) U.S. Cl.
CPC ........ *H01L 27/0629* (2013.01); *H01L 27/092* (2013.01); *H01L 29/872* (2013.01)

(58) Field of Classification Search
CPC .......... H01L 33/24; H01L 33/36; H01L 33/58
USPC ........................................................... 257/98
See application file for complete search history.

(56) References Cited

U.S. PATENT DOCUMENTS

| | | | |
|---|---|---|---|
| 5,629,542 A | 5/1997 | Sakamoto et al. | |
| 2011/0122667 A1* | 5/2011 | Mino | H02M 1/4208 363/125 |
| 2011/0284862 A1* | 11/2011 | Zhang | H01L 27/085 257/76 |
| 2012/0262220 A1 | 10/2012 | Springett | |
| 2013/0240893 A1* | 9/2013 | Bedell | H01L 27/088 257/76 |

FOREIGN PATENT DOCUMENTS

JP    H11-215835 A    8/1999

* cited by examiner

*Primary Examiner* — Marc Armand
*Assistant Examiner* — Warren H Kilpatrick
(74) *Attorney, Agent, or Firm* — David M. Tennant

(57) ABSTRACT

A power semiconductor device includes: a first MOSFET having a first conductivity type including a first source, a first drain, and a first gate; a second MOSFET having a first conductivity type including a second drain, a second source electrically coupled to the first source, and a second gate electrically coupled the first gate; and a diode being coupled between the first and second drains. A breakdown voltage of the first MOSFET is higher than that of the second MOSFET

17 Claims, 3 Drawing Sheets

POWER SEMICONDUCTOR DEVICE

CROSS-REFERENCE TO RELATED APPLICATIONS

This application is based upon and claims the benefit of priority from Japanese Patent Application No. 2015-177695, fed Sep. 9, 2015, the entire contents of which are incorporated herein by reference.

FIELD

Embodiments of the invention described herein relate generally to a power semiconductor device.

BACKGROUND

A power semiconductor device configured with a combination of two types of semiconductor devices including a high voltage device and a low voltage device and a diode is conventionally known.

DETAILED DESCRIPTION

Figure 1:
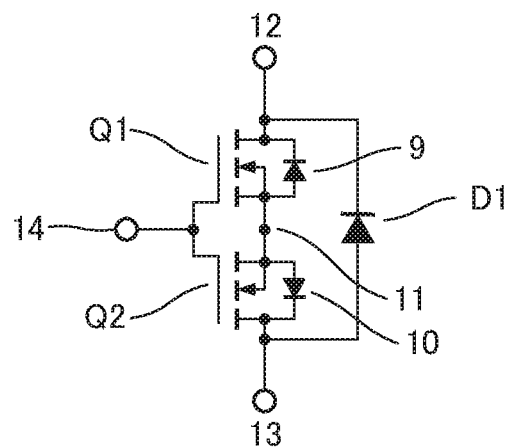
FIG. 1 is a circuit diagram showing a power semiconductor device according to a first embodiment.

In general, according to one embodiment, a power semiconductor device includes a first MOSFET (Metal-Oxide Semiconductor Field-Effect Transistor) having a first conductivity type including a first source, a first drain, and a first gate, a second MOSFET having a first conductivity type including a second drain, a second source electrically coupled to the first source, and a second gate electrically coupled to the first gate, and a diode coupled between the first and second drains. A breakdown voltage of the first MOSFET is higher than that of the second MOSFET.

The exemplary embodiments will be described below with reference to the drawings. In the description, components with approximately the same functions and configurations are denoted by the same reference numerals, and duplicate descriptions are given only when needed.

FIG. 1 is a circuit diagram of a power semiconductor device 1 according to a first embodiment.

In this embodiment, a first power MOSFET (Q1) and a second power MOSFET (Q2) are coupled in series.

The first MOSFET is a first conductivity type which is an N channel type and has a medium and high breakdown voltage characteristic.

The second MOSFET is an N channel type and has a low breakdown voltage characteristic.

The first and second MOSFETs (Q1 and Q2) have a common gate where their respective gates are electrically coupled to each other, a common source 11 where their respective sources are electrically coupled to each other, and respective drains.

The common gate is coupled to an external terminal 14. Each of the drains is coupled to external terminals 12 and 13, respectively. The common source 11 is not coupled to any external terminal.

In addition, a high speed diode (D1) is coupled between the respective drains (or terminals 12 and 13) of the first and second MOSFETs (Q1 and Q2).

That is, the high speed diode (D1) is configured to be coupled in parallel to the both MOSFETs (Q1 and Q2)

A cathode of the high speed diode (D1) is coupled to the first MOSFET (Q1) side. An anode of the high speed diode (D1) is coupled to the second MOSFET (Q2) side.

A compound diode such as a SiC-based diode (e.g., schottky barrier diode; SBD) is suitable as an example of the high speed diode (D1) because of having characteristics for its high breakdown voltage and its high speed.

A combination of these three semiconductor devices (the first and second MOSFETs (Q1 and Q2) and the high speed diode (D1) can be regarded from the outside as one MOSFET having three terminals of 12 (drain), 13 (source), and 14 (gate).

Here, on-resistance of the second MOSFET (Q2) is lower than that of the first MOSFET (Q1). In addition, a first voltage is applied to the terminal 12 and a second voltage is applied to the terminal 13 (herein, the first voltage>the second voltage).

Reference numerals 9 and 10 denote parasitic diodes which the first and second MOSFETs (Q1 and Q2) have, respectively.

The parasitic diodes 9 and 10 have rectifications from the common source 11 to the external terminals 12 and 13, respectively.

Regarding the breakdown voltage of the MOSFETs in the description of the embodiment, a low breakdown voltage may be, for example, 200V or less, typically, 100V or less. And a medium and high breakdown voltage may be, for example, 500V or more. A high breakdown voltage may be, for example, several KV or more.

Furthermore, as a structure of a power semiconductor device, a planar gate structure in which a gate is provided above a surface of a substrate in a surface direction and a trench gate structure in which a gate is provided vertically to a surface of a substrate are mainly known.

Although the trench gate structure has low on-resistance, the planar gate structure is more generally used as a high breakdown voltage transistor because of its advantageous in terms of performance and cost.

In the embodiment, either the planar gate structure or trench gate structure can be employed. And in the both gate structures, a super junction structure may be possibly adopted.

In the super junction structure, for example, an N type conductive layer (N-layer) and a P type conductive layer (P-layer) which are adjacent to a surface of a substrate are extended alternately, and impurity concentrations of the N-layer and P-layer are approximately the same level.

With this structure, electrons flow through the N-layer in an ON state and the N-layer and P-layer are depleted to obtain a uniform electric field distribution in an OFF state, and thereby a breakdown voltage can be increased.

Accordingly, low on-resistance can be achieved in spite of being a high breakdown voltage.

Figure 2:
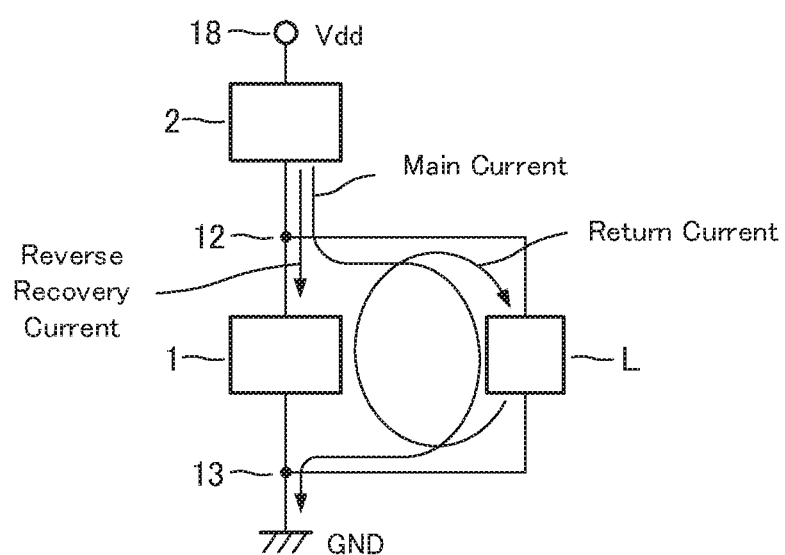
FIG. 2 shows a control circuit, using the power semiconductor device according to the first embodiment.

Referring now to FIG. 2, there is shown an embodiment. In the embodiment, Power semiconductor device of the embodiment which includes a first MOSFET, a second MOSFETs (Q1 and Q2) and a high speed diode (D1) is applied to a control circuit (herein, a half bridge circuit) which utilizes induction load, etc.

The control circuit of FIG. 2 includes a first power semiconductor device 1 (including Q1, Q2 and D1) which is shown in FIG. 1.

As a load, for example, an inductance (L) such as a motor coil is coupled in parallel to the first power semiconductor device 1, between the terminal 12 and terminal 13 of the first power semiconductor device 1.

Further, a second power semiconductor device 2 is coupled in series to the first power semiconductor device 1 through the terminal 12.

The circuit configuration of the second power semiconductor device 2 is basically the same as that of the first power semiconductor device 1. That is, it includes a third MOSFET (Q3), a fourth MOSFET (Q4), and a high speed diode (D2) (Q3, Q4, and D2 are not shown).

The third and fourth MOSFETs (Q3 and Q4) have a common gate and a common source as with the first power semiconductor device 1. Each common gate of the first and second power semiconductor devices 1 and 2 is independently controlled.

In addition, a terminal 18 which is on the opposite side of the terminal 12 from the second power semiconductor device 2 is coupled to a power supply voltage Vdd. The terminal 13 located at the first power semiconductor device 1 side is ground potential (GND).

Here, the embodiment is described as being applied to a half bridge circuit, however, is also applicable to other control circuits such as a full bridge circuit, etc.

Operation of the control circuit as the half bridge circuit to which the power semiconductor device of the first embodiment is applied will now be described below.

Firstly, when a voltage signal is applied between a common gate terminal of the second power semiconductor device 2 and the terminal 12 (for example, the applied gate voltage is 10V or more), the third and fourth MOSFETs (Q3 and Q4) simultaneously become an ON state (this timing is represented by T1 at which the second power semiconductor device 2 is switched on) and a main current flows from the terminal 18 to the terminal 12.

At this time, the first power semiconductor device 1 is switched of (the first and second MOSFETs (Q1 and Q2) are an an OFF state) and the current does not flow to the first power semiconductor device 1, but flows to the load (L) side.

Secondly, the third and fourth MOSFETs (Q3 and Q4) are turned to an OFF state (this timing is represented by T2 at which the second power semiconductor device 2 is switched off).

The first power semiconductor device 1 is also switched off (the first and second MOSFETs (Q1 and Q2) are in the OFF state).

When the second power semiconductor device 2 is turned off, potential of the terminal 12 becomes lowered and a return current flows into the first power semiconductor device 1.

In the embodiment, the parasitic diode 10 of the second MOSFET (Q2) blocks the return current, so that the return current does not flow into the parasitic diode 9 of the first MOSFET (Q1), but flows into the high speed diode (D1).

Thirdly, while the return current flows through the high speed diode (D1), the second power semiconductor device 2 is switched on again and a voltage is applied between the terminal 12 and the terminal 13 (this timing is represented by T3 at which the second power semiconductor device 2 is switched on (i.e. the third and fourth MOSFETs (Q3 and Q4) are in the ON state)). Upon this timing, a reverse recovery current flows from the terminal 12 to the terminal 13 thorough the high speed diode (D1).

The reverse recovery current is substantially more dominant than the return current since the potential of the terminal 12 increases.

A reverse recovery loss in the switching operation shifting from T1 to T2 and then from T2 to T3 is determined depending on performance of the high speed diode (D1) since the return current does not flow through the parasitic diodes 9 and 10 of the first and second MOSFETs (Q1 and Q2) as described above.

That is, the reverse recovery loss may be reduced with the high speed diode (D1) according to the embodiment.

Now, the first power semiconductor device 1 of the embodiment (Q1+Q2+D1) is compared with a first MOSFET (Q1) solely.

Figure 3:
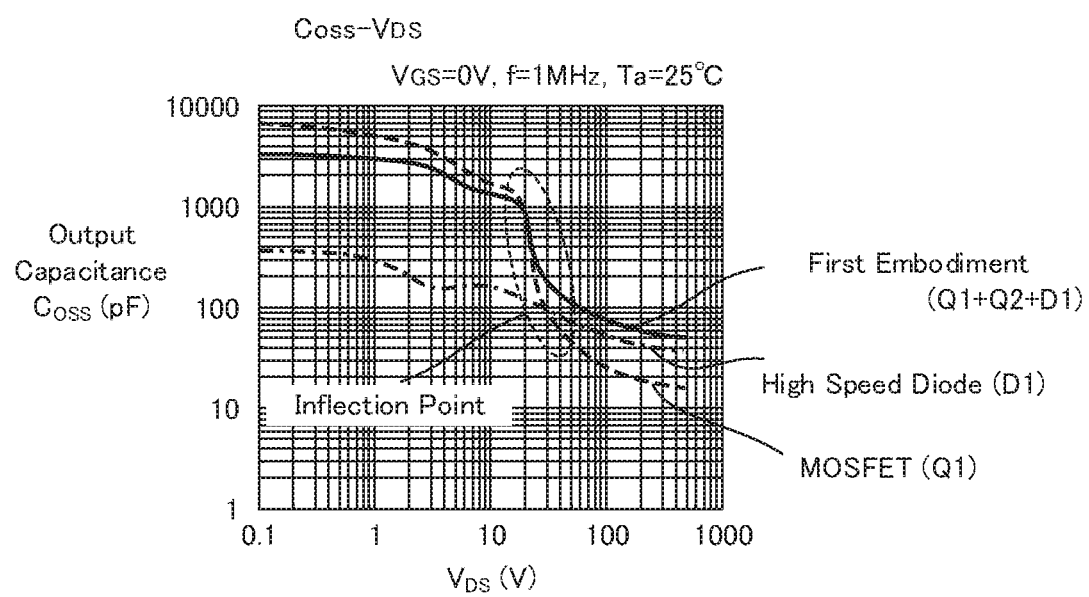
FIG. 3 is a characteristic diagram for explaining an effect of the first embodiment.

FIG. 3 is a characteristic diagram showing comparison of output capacitance (COSS) corresponding to a drain-source voltage VDS under the condition of VGS=0V (i.e. a gate-source voltage is 0V: a switch is off), f=1 MHz, and Ta=25° C.

The output capacitance (COSS) is generally represented by a sum of a gate-drain capacitance CGD and a drain-source capacitance CDS.

The output capacitance (COSS) of the embodiment is smaller than that of the first MOSFET (Q1) alone in a lower range of the drain-source voltage VDS (Q1; voltage between terminals 12 and 11, Q1+Q2+D1; voltage between terminals 12 and 13) being, for example, 10V or less.

This occurs because a total capacitance of Q1 reduces in a low voltage region where the voltage VDS is, for example, 10V or less, and the output capacitance (COSS) of the embodiment to which a capacitance of the high speed diode (D1) is added becomes smaller.

On the other hand, in a higher range of the voltage VDS being, for example, around 30V or more, capacitance components of the high speed diode (D1) appear and the output capacitance (COSS) of the embodiment becomes larger.

This occurs because reduction in the total capacitance of Q1 is small in a high voltage region where the voltage VDS is, for example, around 30V or more, and the output capacitance (COSS) of the embodiment to which the capacitance of the high speed diode (D1) is added becomes larger.

Accordingly, compared with the power semiconductor device including the first MOSFET alone, the power semiconductor device 1 of the embodiment which includes the first and second MOSFETs (Q1 and Q2) and the high speed diode (D1) has a smaller capacitance difference between before and after an inflection point of an output capacitance curve which the voltage VDS varies from a low voltage to a high voltage (here, the inflection point is defined as a region where the output capacitance decreases by two digits or more, for example, from several 1000 pF to several 10 pF).

If a capacitance difference corresponding to a variation of voltage VDS between before and after the inflection point is too large, noise may occur during a high speed switching operation.

However, the first embodiment can make the capacitance difference be small in the inflection point, resulting in being advantageous in terms of noise.

In general, having a predetermined, approximately two digits of output capacitance difference corresponding to a variation of voltage VDS results in reducing a current to charge a capacitance.

This also leads to reduce a switching loss and thus it is necessary to have such amount of difference of the output capacitance.

As a result, effect of the noise also can be reduced while reducing the switching loss according to the first embodiment.

Figure 4:
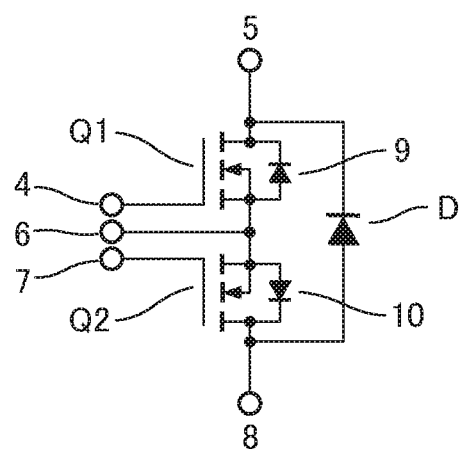
FIG. 4 is a circuit diagram showing a comparative example of a power semiconductor device.

FIG. 4 is a circuit diagram showing a power semiconductor device of a comparative example of the first embodiment.

According to the comparative example, a first MOSFET (Q1) and a second MOSFET (Q2) are coupled in series. In addition, each of gates of the first and second MOSFETs (Q1 and Q2) is respectively coupled to terminals 4 and 7, and each of sources is coupled to a common terminal 6. Further, each of drains of the first and second MOSFETs (Q1 and Q2) is coupled to terminals 5 and 8, respectively.

The first MOSFET (Q1) is a N channel type and has a medium and high breakdown voltage characteristic and the second MOSFET (Q2) is a N channel type and has a low breakdown voltage characteristic.

In addition, a Si-based high speed diode (D) is provided between the respective drains (terminals 5 and 8) of the first and second MOSFETs (Q1 and Q2).

The diode (D) maybe, exemplarily, a high speed PN diode, etc.

The reference numerals 9 and 10 denote parasitic diodes which the first and second MOSFETs (Q1 and Q2) have, respectively.

The parasitic diodes 9 and 10 have rectifications from the common source 6 to the terminals 5 and 8, respectively.

When voltage signals are applied to the gate terminals 4 and 7, the source terminal 6, and the terminals 5 and 8, the first and second MOSFETs (Q1 and Q2) operate approximately at the same time.

According to the comparative example, the first MOSFET (Q1) and the second MOSFET (Q2) have the respectively independent gate terminals 4 and 7, the common source terminal 6, and the respective drain terminals 5 and 8.

A power supply voltage Vdd is applied to the terminal 5 and ground potential (GND) is applied to the terminal 8.

That is to say, the comparative example as a whole is a MOSFET including 5 terminals and therefore, the comparative example is different from the first embodiment in this respect.

Additionally, the comparative example is different from the first embodiment with respect to the Si-based diode (D) provided between the drain terminals 5 and 8.

Herein, the following case that such a configuration of the comparative example is applied to a control circuit (herein, a half bridge circuit) is assumed. The control circuit uses an inductive loading, etc. by which a return current flows thorough the Si-based diode (D) when the first and second MOSFETs (Q1 and Q2) are switched off similarly as mentioned in the first embodiment.

In the comparative example using the Si-based diode, a larger amount of switching loss (reverse recovery loss) occurs, compared with the embodiment using the SiC-based high speed diode, since more time is needed for the reverse recovery due to performance difference of the diodes.

In addition to that, the comparison example also has a larger reverse recovery current, resulting in being disadvantageous in terms of the noise.

The difference of the switching loss as mentioned is caused due to the following reason.

As for the Si-based PN diode, a transient current flows at a time of switching from a forward direction to a reverse direction. During this period a state of the Si-based PN diode transits to a reverse bias state and thereby the large switching loss occurs.

This is because minority carriers accumulated in a drift layer during the forward conduction period contribute to electric conduction until the accumulated carriers disappear.

On the other hand, since the SiC-based high speed diode (e.g., SBD) is a majority carrier device (i.e. unipolar device), accumulation of carriers does not occur in principle and only such a small current that discharges a junction capacitance flows.

Accordingly, using the SiC-based high speed diode for the power semiconductor device can considerably reduce the switching loss (reverse recovery loss), compared with the case the Si-based PN diode is used.

Furthermore, in the comparison example, electric signal circuits (not shown) need to be separately prepared for each of the gate terminals 4 and 7 so as to control driving of the first and second MOSFETs (Q1 and Q2).

On the contrary, according to the first embodiment, a control circuit for applying electrical signals can be simplified since there is the common gate terminal to the first and second MOSFETs (Q1 and Q2) and there is no source terminal.

[Second Embodiment]

Figure 5:
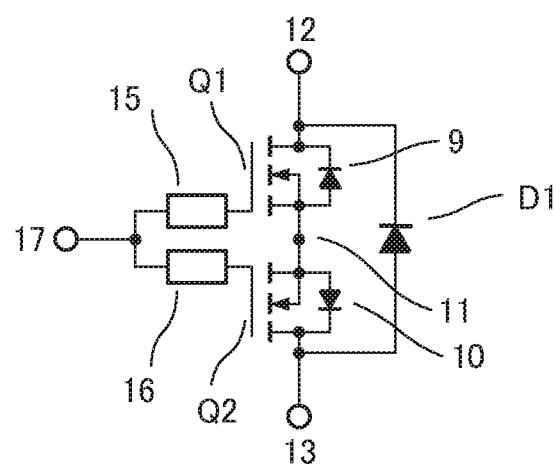
FIG. 5 is a circuit diagram showing a power semiconductor device according to a second embodiment.

FIG. 5 is a circuit diagram of a power semiconductor device according to a second embodiment.

The circuit diagram of the second embodiment is similar to the power semiconductor device of the first embodiment in that each of gates of the first MOSFET (Q1) and the second MOSFET (Q2) is commonly coupled to a gate terminal 17. However, different in that gate resistors 15 and 16 (RG1 and RG2) are inserted between the gate terminal 17 and each of gates of the first and second MOSFETs (Q1 and Q2).

According to this embodiment, in addition to the above-mentioned effects of the first embodiment, such an effect is obtained that can prevent oscillation which responds to small gate voltage signals caused in consequence of parasitic components LC, etc. in the circuit and assure more stable operation.

Furthermore, the first and second embodiments of the present invention are applicable to a wide range of fields, including a control circuit for an inverter air conditioner for consumer use, an industrial power (motor) circuit for a train and an automobile, a power conditioner for a solar power generator, etc.

As described above, the embodiments s are provided as examples and not intended to limit the scope of the invention. Indeed, the novel embodiments described herein may possibly be embodied in a variety of other forms; various omissions, substitutions and changes by referring to the embodiments described herein as long as it is not beyond the scope of the invention.

The embodiments and such variations of the embodiments are included in the scope or summary of the invention and also included in the equivalent of the claimed invention.

What is claimed is:

1. A power semiconductor device comprising:
   a first MOSFET having a first conductivity type including a first source, a first drain, and a first gate;
   a second MOSFET having a first conductivity type including a second drain, a second source electrically coupled to the first source as a common source, and a second gate electrically coupled to the first gate as a common gate; and
   a diode coupled between the first and second drains;

the first MOSFET further includes a first parasitic diode between the common source and the first drain and the second MOSFET includes a second parasitic diode between the common source and the second drain, the first and the second parasitic diodes have a rectification direction from the common source to the drains respectively,
  wherein breakdown voltage of the first MOSFET is higher than that of the second MOSFET.

2. The power semiconductor device according to claim 1, wherein the first conductivity type is an N-channel type.

3. The power semiconductor device according to claim 2, wherein the first power MOSFET is an N-channel type MOSFET having a medium and high breakdown voltage characteristic and the second power MOSFET is a P-channel type MOSFET having a low breakdown voltage characteristic.

4. The power semiconductor device according to claim 2, wherein on-resistance of the second MOSFET is lower than that of the first MOSFET.

5. The power semiconductor device according to claim 1, wherein operating speed of the diode is higher than that of the parasitic diodes of the first and second MOSFETs.

6. The power semiconductor device according to claim 5, wherein the diode includes a SiC schottky barrier diode.

7. The power semiconductor device according to claim 1, wherein the first MOSFET and the second MOSFET are coupled to one common terminal and a resister is respectively provided between the gates of the first and the second MOSFETs and the common terminal.

8. The power semiconductor device according to claim 7, wherein each of the drains of the first MOSFET and the second MOSFET is coupled to a first and a second external terminals and a cathode of the diode is coupled to the first external terminal and an anode of the diode is coupled to the second external terminal.

9. The power semiconductor device according to claim 8, wherein the power semiconductor device is controlled with using only three terminals of the common terminal of the first and the second MOSFETs, the first external terminal, and the second external terminal.

10. The power semiconductor device according to claim 1, wherein the first MOSFET and the second MOSFET are power MOSFETs of which the respective gates are coupled to a common terminal, and
  a current flows from the first drain to the second drain when the first MOSFET and the second MOSFET are ON; and a current flows from the second drain through the diode to the first drain when the first MOSFET and the second MOSFET are OFF and a return current flows.

11. A control circuit includes a plurality of the power semiconductor devices recited in claim 1.

12. The control circuit comprises a half bridge circuit or a full bridge circuit recited in claim 11.

13. A control circuit comprising:
a first power semiconductor device which includes;
a first MOSFET having a first conductivity type including a first source, a first drain, and a first gate,
a second MOSFET having a first conductivity type including a second drain, a second source electrically coupled to the first source as a first common source, and a second gate electrically coupled to the first gate as a first common gate, and
a first diode coupled between the first and second drains,
the first MOSFET includes a first parasitic diode between the first common source and the first drain and the second MOSFET includes a second parasitic diode between the first common source and the second drain, the first and the second parasitic diodes have a rectification direction from the first common source to the drains respectively;
and
a second power semiconductor device which includes;
a third MOSFET having a first conductivity type including a third source, a third drain, and a third gate,
a fourth MOSFET having a second conductivity type including a fourth drain, a fourth source electrically coupled to the third source as a second common source, and a fourth gate electrically coupled to the third gate as a second common gate, and
a second diode coupled between the third and fourth drains,
the third MOSFET includes a third parasitic diode between the second common gate and the third drain and the fourth MOSFET includes a fourth parasitic diode between the second common source and the fourth drain, the third and fourth parasitic diodes have a rectification direction from the second common source to the drains respectively;
wherein breakdown voltage of the first MOSFET is higher than that of the second MOSFET and breakdown voltage of the third MOSFET is higher than that of the fourth MOSFET.

14. A control circuit according to claim 13, the first power semiconductor device and the second power device is coupled in series between a power supply potential and a ground potential.

15. A control circuit according to claim 14, the drain of the second MOSFET of the first power semiconductor device is coupled to the ground potential, the drain of the third MOSFET of the second power semiconductor device is coupled to the power supply potential, and an inductance is coupled in parallel to the first power semiconductor device.

16. A control circuit according to claim 13, a return current flows into the first diode of the first MOSFET but not flows into the first parasitic diode by the second parasitic diode blocking when the second power semiconductor device is turned OFF, and a reverse recovery current flows into the first diode but not flows through the first and second parasitic diodes blocking when the second power semiconductor device is turned ON.

17. A control circuit according to claim 16, during the return current flowing, the second power semiconductor is turned ON to increase the potential of the first drain and thereby the reverse recovery current being substantially more dominant than the return current.

* * * * *